United States Patent
Tanaka

[11] Patent Number: 6,088,275
[45] Date of Patent: Jul. 11, 2000

[54] SEMICONDUCTOR MEMORY DEVICE OPERATING AT A LOW LEVEL POWER SUPPLY VOLTAGE

[75] Inventor: Hidehiko Tanaka, Nara, Japan

[73] Assignee: Sharp Kabushiki Kaisha, Osaka, Japan

[21] Appl. No.: 09/021,187

[22] Filed: Feb. 10, 1998

[30] Foreign Application Priority Data

Mar. 19, 1997 [JP] Japan ................................ 9-067066

[51] Int. Cl.[7] ............................................. G11C 7/00
[52] U.S. Cl. ................ 365/205; 365/189.09; 365/189.11
[58] Field of Search ................................ 365/205, 149, 365/189.09, 189.11, 226, 189.01

[56] References Cited

U.S. PATENT DOCUMENTS

| 5,544,110 | 8/1996 | Yuh | 365/205 |
| 5,646,880 | 7/1997 | Yuh | 365/149 |
| 5,657,278 | 8/1997 | Lee | 365/189.09 |
| 5,719,814 | 2/1998 | Ishikawa | 365/205 |
| 5,745,423 | 4/1998 | Tai | 365/203 |

FOREIGN PATENT DOCUMENTS

| 2-18784 | 1/1990 | Japan . |
| 4-281291 | 10/1992 | Japan . |
| 6-215571 | 8/1994 | Japan . |

*Primary Examiner*—David Nelms
*Assistant Examiner*—Hoai V. Ho
*Attorney, Agent, or Firm*—Morrison & Foerster LLP

[57] ABSTRACT

A semiconductor memory device having: a pair of bit signal lines; a sense amplifier disposed between the pair of bit signal lines; a ground potential side transistor inserted between the sense amplifier and a ground potential; and a power supply potential side transistor circuit inserted between the sense amplifier and a power supply potential network. When the ground potential side transistor is turned ON, one of the pair of bit signal lines which is closer to the ground potential is pulled into the ground potential via the sense amplifier, and when the power supply potential side transistor circuit is turned ON, the other one of the pair of bit signal lines which is closer to the power supply potential is pulled into the power supply potential via the sense amplifier, thereby amplifying a potential difference between the pair of bit signal lines.

12 Claims, 14 Drawing Sheets

FIG. 17 (PRIOR ART)
FIG. 18 (PRIOR ART)
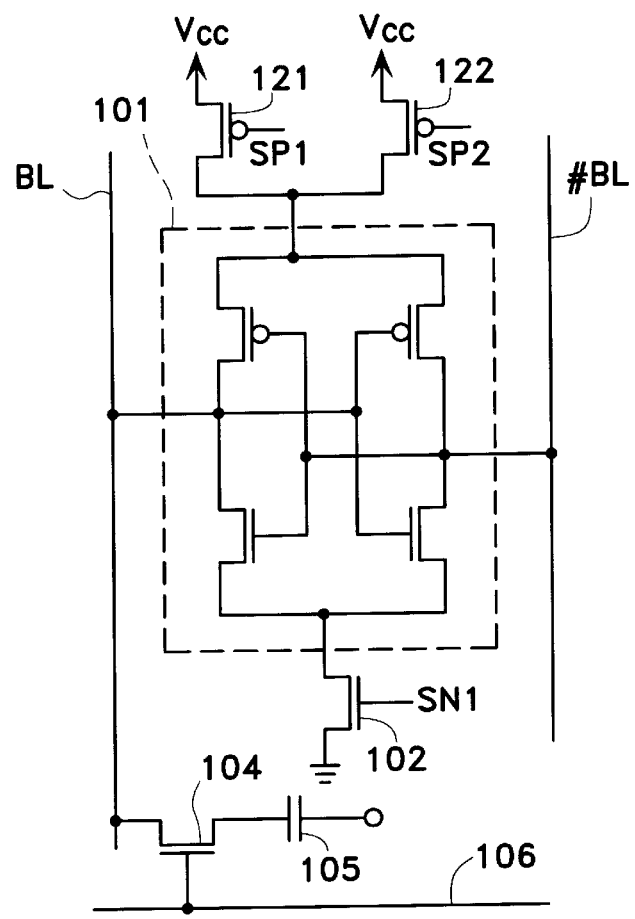
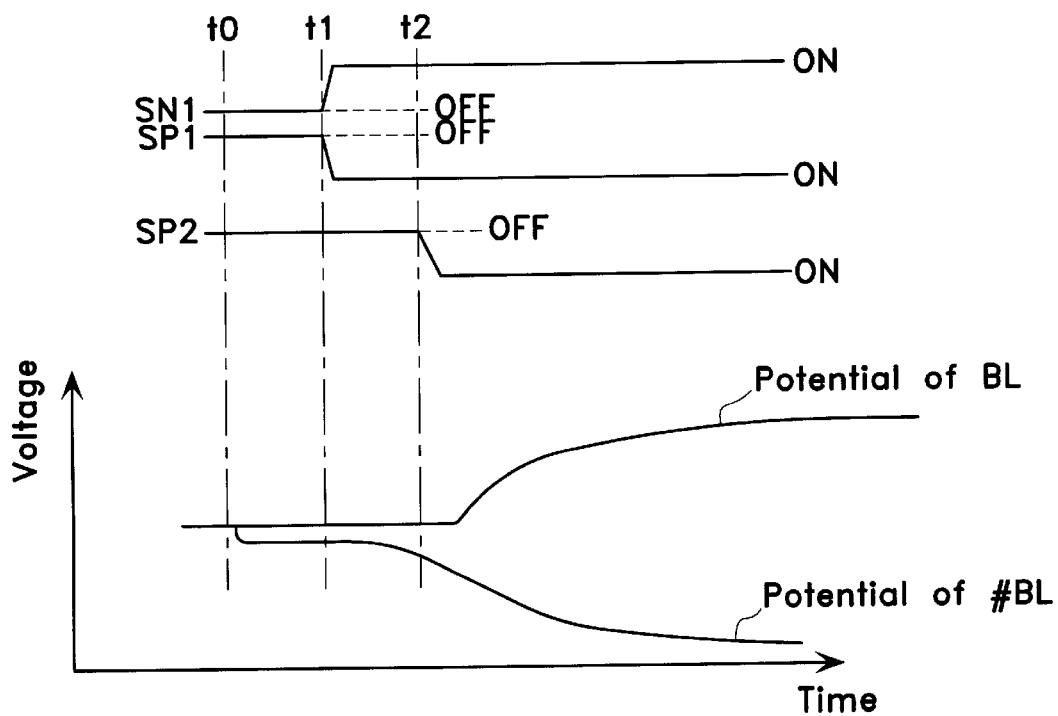

FIG. 19
(PRIOR ART)
FIG. 20
(PRIOR ART)
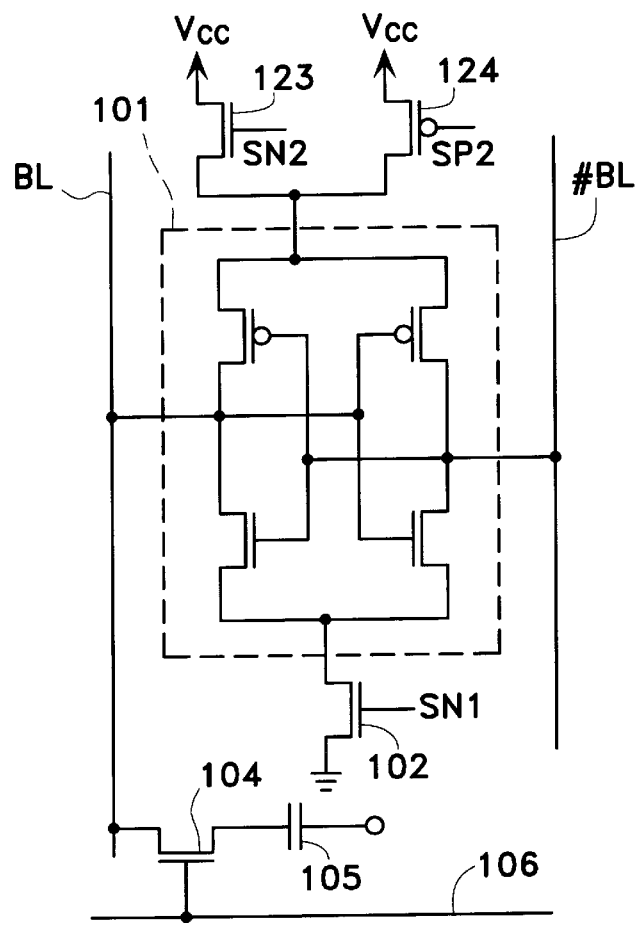
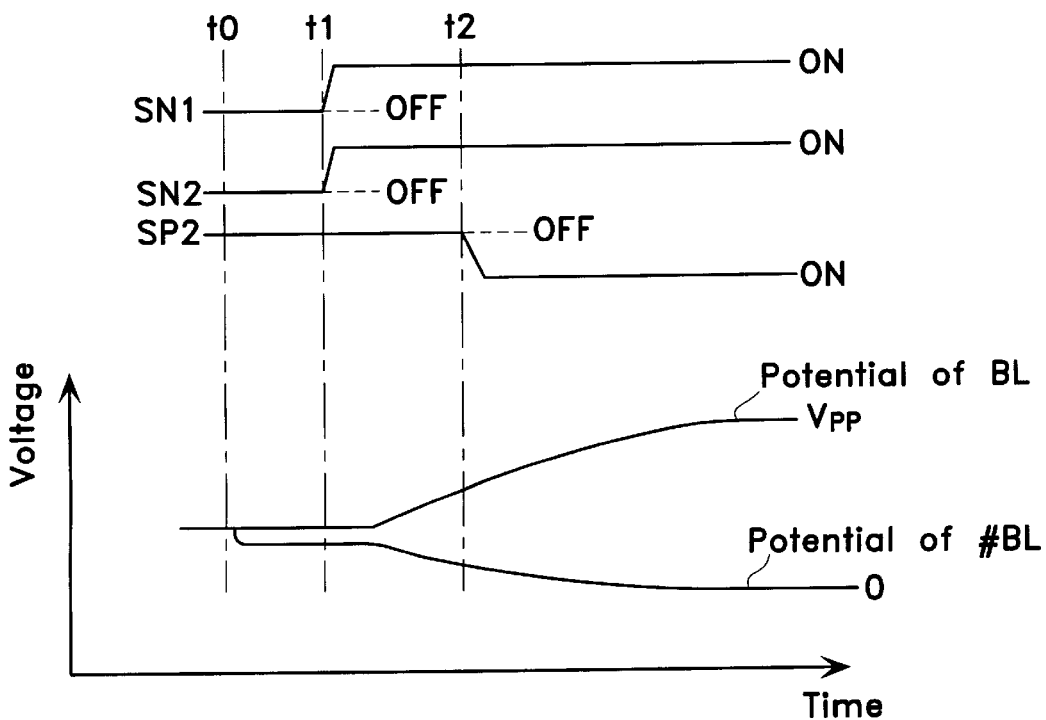

SEMICONDUCTOR MEMORY DEVICE OPERATING AT A LOW LEVEL POWER SUPPLY VOLTAGE

BACKGROUND OF THE INVENTION

1. Field of the Invention

The present invention relates to a semiconductor memory device. More specifically, the present invention relates to a semiconductor memory device which operates at a low level power supply voltage.

2. Description of the Related Art

FIG. 13 is an example of a semiconductor memory device. In FIG. 13, a sense amplifier 101 is disposed between a pair of bit signal lines BL and #BL, and an N-channel transistor 102 is inserted between the sense amplifier 101 and a ground. A P-channel transistor 103 is inserted between the sense amplifier 101 and a power supply potential Vcc. In addition, a memory capacitor 105 is connected to the bit signal line BL via a transistor 104, and a word signal line 106 is connected to a gate of the transistor 104.

The sense amplifier 101 includes P-channel transistors 111 and 112 and N-channel transistors 113 and 114. The P-channel transistor 111 and the N-channel transistor 113, which are on the left side of the sense amplifier 101, are serially connected. The bit signal line BL is connected to a point between the transistors 111 and 113, and the bit signal line #BL is connected to the gates of the transistors 111 and 113. Similarly, the P-channel transistor 112 and the N-channel transistor 114, which are on the right side of the sense amplifier 101, are serially connected. The bit signal line #BL is connected to a point between these transistors 112 and 114, and the bit signal line BL is connected to the gates of the transistors 112 and 114.

In such a structure, when the transistor 104 is turned ON via the word signal line 106, a signal charge of the memory capacitor 105 is transferred to the bit signal line BL, thereby generating a potential difference between the bit signal lines BL and #BL. Although this potential difference is very small, when the N-channel transistor 102 and the P-channel transistor 103 are turned ON at an appropriate timing described below, the potential difference between the bit signal lines BL and #BL is amplified by the sense amplifier 101. As a result, one of the bit signal lines BL and #BL which has a lower potential decreases toward a ground potential, and the other one of the bit signal lines BL and #BL which has a higher potential increases toward the power supply potential Vcc. This enables the signal charge of the memory capacitor 105 to be readily read out or rewritten.

Since a semiconductor memory device includes a large number of the memory capacitors 105, the bit signal lines BL and #BL, and the sense amplifiers 101, the large number of sense amplifiers 101 are operated at the same time. As a result, a large momentary current is generated within the memory device. At this time, a voltage drop due to a line resistance which supplies the power supply potential Vcc to each of the sense amplifiers 101 becomes large. This causes a voltage drop of the sense amplifier 101 to be small (i.e., a potential difference between a source and a drain of each of the transistors in the sense amplifier 101 becomes small), thereby resulting in a slow amplification by the sense amplifier 101.

In order to overcome such amplification delay by the sense amplifier 101, it is necessary to adjust the timing for turning ON the N-channel transistor 102 and the P-channel transistor 103.

As one example of a method for adjusting the timing is described below. As shown in a timing chart of FIG. 14, a signal SN1 is switched to a high level at a point t1, thereby turning ON the N-channel transistor 102, and one of the bit signal lines BL or #BL which has a lower potential decreases toward the ground potential through the N-channel transistor 102 and one of the N-channel transistors 113 or 114 in the sense amplifier 101. At a point t2, a signal SP1 is switched to a low level, thereby turning ON the P-channel transistor 103, and the other one of the bit signal lines BL or #BL which has a higher potential increases toward the power supply potential Vcc through the P-channel transistor 103 and one of the P-channel transistors 111 or 112 in the sense amplifier 101.

In the above-described case, since the driving capabilities of the N-channel transistors 113 and 114 are high, the bit signal line which has a lower potential can be quickly decreased toward the ground potential. On the contrary, the driving capabilities of the P-channel transistors 111 and 112 are low, i.e., their threshold voltages are high, and their capabilities to supply current are low. As a result, it takes additional time to make the bit signal line which has a higher potential increase toward the power supply potential Vcc. The additional time period is equal to the time lag of the point t2 with respect to the point t1 (t2−t1) plus the time required for the bit signal line to reach the power supply potential Vcc, thereby resulting in a slow operating speed of the sense amplifier 101.

Alternatively, there is another method for adjusting the timing which is shown in a timing chart of FIG. 15. At a point t1, a signal SP1 is switched to a low level, thereby turning ON the P-channel transistor 103, and one of the bit signal lines increases toward the power supply potential Vcc. At a point t2, a signal SN1 is switched to a high level, thereby turning ON the N-channel transistor 102, and the other one of the bit signal lines quickly decreases toward the ground potential.

In such a case, since the P-channel transistor 103 is turned ON first and thus the P-channel transistors 111 and 112 which have low driving capabilities are given priority, the operating speed of the sense amplifier 101 is improved as compared to the method shown in FIG. 14.

Also, there is another method for adjusting the timing as shown in a timing chart of FIG. 16. At a point t1, a signal SP1 is switched to a low level, thereby turning ON the P-channel transistor 103, and one of the bit signal lines increases toward the power supply potential Vcc. At the same time, a signal SN1 is switched to a high level, thereby turning ON the N-channel transistor 102, and the other one of the bit signal lines decreases toward the ground potential.

In this case, as compared to the methods shown in FIGS. 14 and 15, a period between the point t1 and t2 can be omitted. However, since the driving by the P-channel transistors 111 and 112 and the driving by the N-channel transistors 113 and 114 in the sense amplifier 101 are started at the same time, a feedthrough current flowing through the sense amplifier 101 is generated. As a result, the ground potential is apparently increased from the standpoint of the sense amplifier. Accordingly, the potential of the bit signal line does not drop rapidly, and thus the improvement in the operating speed of the sense amplifier 101 is small.

As described above, the delay in the amplification by the sense amplifier 101 can be adjusted in accordance with the setting of the timing for turning ON the N-channel transistor 102 and the P-channel transistor 103.

Also, there is another method which incorporates additional transistors as shown in FIG. 17. According to this method, a first P-channel transistor 121 having a small current supplying capability and a second P-channel transistor 122 having a large current supplying capability are inserted in parallel between the sense amplifier 101 and the power supply potential Vcc. As shown in a timing chart of FIG. 18, at a point t1, signals SN1 and SP1 are switched to a high level and a low level, respectively, thereby turning ON an N-channel transistor 102 and the first P-channel transistor 121. One of the bit signal lines decreases toward a ground potential whereas the potential of the other one of the bit signal lines is prevented from dropping. At a point t2, a signal SP2 is switched to be a low level, thereby turning ON the second P-channel transistor 122, and the other one of the bit signal lines quickly increases toward the power supply potential Vcc.

In this case, as compared to the method shown in FIG. 16, the feedthrough current flowing through the sense amplifier 101 is reduced, thereby improving the operating speed to the same level as in the method shown in FIG. 15.

Recently, however, there is a tend to reduce the power supply potential in order to realize a reduction in the power consumption of a semiconductor memory device. For example, the power supply potential is reduced to from level of about 5V to about 3.3V.

When the power supply potential is reduced as described above, the amount of current supplied by the transistor 103 or 122 inserted between the sense amplifier 101 and the power supply potential Vcc is reduced. As a result, the amplification by the sense amplifier 101 for making the bit signal line increase toward the power supply potential Vcc is further delayed. Thus, even with any one of the methods shown in FIGS. 14, 15, 16, and 18, the amplification speed of the sense amplifier 101 cannot be sufficiently increased.

In consideration of this result, there is another method which incorporates additional transistors as shown in FIG. 19. According to this method, two power supply potentials, the power supply potential Vcc and a high level power supply potential Vpp which is obtained by boosting the voltage of the power supply potential Vcc, are provided. In addition, an N-channel transistor 123 is inserted between the low level power supply potential Vcc and the sense amplifier 101, and a P-channel transistor 124 is inserted between the high level power supply potential Vpp and the sense amplifier 101 (see Japanese Laid-open Publication No. 4-281291).

In this case, as shown in a timing chart of FIG. 20, both signals SN1 and SN2 are switched to a high level at a point t1. The N-channel transistor 102 and the N-channel transistor 123 on the side of the low level power supply potential Vcc are turned ON. One of bit signal lines decreases toward a ground potential whereas the potential of the other one of the bit signal lines is prevented from dropping. At a point t2 where a potential difference between the bit signal lines has developed to a certain degree, a signal SP2 is switched to a low level, thereby turning ON the P-channel transistor 124, and the other one of the bit signal lines increases toward the high level power supply potential Vpp.

In this case, since the bit signal line with the high potential attempts to reach the high level power supply potential Vpp, the current supplied by the P-channel transistor 124 does not decline at least until the potential of the appropriate bit signal line exceeds the low level power supply potential Vcc. As a result, the potential of this bit signal line rapidly reaches the low level power supply potential Vcc (Vcc is the potential needed for the signal charge of the memory capacitor 105 to be read out and rewritten). However, since the current supplying capability of the N-channel transistor 102 is large and the feedthrough current flowing through the sense amplifier 101 is not negligible, the ground potential is apparently raised from the standpoint of the sense amplifier and a drop in the potential of the bit signal line is delayed.

Similarly, there is a method which incorporates additional transistors and other circuit components as shown in FIG. 21. According to this method, the low level power supply potential Vcc and the high level power supply potential Vpp are provided as power supply potentials. A first P-channel transistor 125 is inserted between the low level power supply potential Vcc and the sense amplifier 101, and a second P-channel transistor 126 is inserted between the high level power supply potential Vpp and the sense amplifier 101. A diode 127 for preventing reverse current conduction is inserted between the first P-channel transistor 125 and the second P-channel transistor 126.

As shown in a timing chart of FIG. 22, at a point t1, the N-channel transistor 102 and the first P-channel transistor 125 on the side of the low level power supply potential Vcc are turned ON. One of the bit signal lines decreases toward a ground potential whereas the potential of the other one of the bit signal lines is prevented from dropping. At a point t2, the second P-channel transistor 126 is turned ON, and the other one of the bit signal lines rapidly increases toward the high level power supply potential Vpp.

With either of the methods shown in FIGS. 20 and 22, however, an improvement in the operating speed of the sense amplifier 101 is still insufficient. Therefore, there is a great need for further increasing the operating speed.

SUMMARY OF THE INVENTION

According to one aspect of this invention, a semiconductor memory device includes: a pair of bit signal lines; a sense amplifier disposed between the pair of bit signal lines; a ground potential side transistor inserted between the sense amplifier and a ground potential; and a power supply potential side transistor circuit inserted between the sense amplifier and a power supply potential network. When the ground potential side transistor is turned ON, one of the pair of bit signal lines which is closer to the ground potential is pulled into the ground potential via the sense amplifier, and when the power supply potential side transistor circuit is turned ON, the other one of the pair of bit signal lines which is closer to the power supply potential is pulled into the power supply potential via the sense amplifier, thereby amplifying a potential difference between the pair of bit signal lines. The power supply potential network includes a first power supply potential and a second power supply potential closer to the ground potential than the first power supply potential. The power supply potential side transistor circuit includes a first power supply potential side transistor inserted between the sense amplifier and the first power supply potential and a second power supply potential side transistor inserted between the sense amplifier and the second power supply potential. The first power supply potential side transistor is turned ON for a predetermined period of time; the ground potential side transistor is turned ON during the predetermined time period and the ON state of the ground potential side transistor is maintained, and when the predetermined time period ends, the second power supply potential side transistor is turned ON.

According to such a structure, firstly, the first power supply potential side transistor is turned ON for a predetermined period of time. As a result, one of the bit signal lines which is closer to the power supply potential rapidly rises to the high level first power supply potential through the sense amplifier. Next, the ground potential side transistor is turned ON. Thus, the other one of the bit signal lines which is closer to the ground potential is pulled into the ground potential before its potential is attracted to the power supply potential. Finally, the first power supply potential side transistor is turned OFF, and at the same time, the second power supply potential side transistor is turned ON. As a result, the bit signal line having the potential which had already been rapidly raised can be retained at the low level second power supply potential.

In one embodiment of the present invention, the power supply potential is set higher than the ground potential; an N-channel transistor is used as the ground potential side transistor and P-channel transistors are used as the first and the second power supply potential side transistors; and the sense amplifier includes N-channel transistors which pull the one of the pair of bit signal lines which is closer to the ground potential into the ground potential via the sense amplifier and P-channel transistors which pull the other one of the pair of bit signal lines which is closer to the power supply potential into the power supply potential.

In another embodiment of the present invention, the power supply potential is set higher than the ground potential; an N-channel transistor is used as the ground potential side transistor and a P-channel transistor and an N-channel transistor are used as the first power supply potential side transistor and the second power supply potential side transistor, respectively; and the sense amplifier includes N-channel transistors which pull the one of the pair of bit signal lines which is closer to the ground potential into the ground potential via the sense amplifier and P-channel transistors which pull the other one of the pair of bit signal lines which is closer to the power supply potential into the power supply potential.

In still another embodiment of the present invention, the semiconductor memory device further includes power supply means which is supplied with the second power supply potential and forms the first power supply potential from the second power supply potential.

In still yet another embodiment of the present invention, the semiconductor memory device further includes: a plurality of amplification units, wherein each of the plurality of amplification units include the pair of bit signal lines, the sense amplifier, the ground potential side transistor, the first power supply potential side transistor, and the second power supply potential side transistor, wherein the plurality of amplification units are divided into a plurality of groups; power supply means for supplying the first power supply potential; and controlling means for selecting one of the plurality of groups and turning ON the first power supply potential side transistor in the amplification unit belonging to the selected group.

Herein, since one of the groups is selected, and the first power supply potential side transistors in the amplification units belonging to the selected group are turned ON, the first power supply potential is not supplied to all of the amplification units at the same time. Accordingly, the generation of a large amount of current at the time of supplying the first power supply potential is prevented, and thus the supply shortage of current is avoided.

In still yet another embodiment of the present invention, one of the plurality of groups is selected and the first power supply potential side transistor in the amplification unit belonging to the selected group is turned ON based on a column address input.

According to another aspect of this invention, a semiconductor memory device includes: a pair of bit signal lines; a sense amplifier disposed between the pair of bit signal lines; a ground potential side transistor circuit inserted between the sense amplifier and a ground potential; and a power supply potential side transistor circuit inserted between the sense amplifier and a power supply potential network, wherein when the ground potential side transistor is turned ON, one of the pair of bit signal lines which is closer to the ground potential is pulled into the ground potential via the sense amplifier, and wherein when the power supply potential side transistor circuit is turned ON, the other one of the pair of bit signal lines which is closer to the power supply potential is pulled into the power supply potential via the sense amplifier, thereby amplifying a potential difference between the pair of bit signal lines. The power supply potential network includes a first power supply potential and a second power supply potential closer to the ground potential than the first power supply potential. The power supply potential side transistor circuit includes a first power supply potential side transistor inserted between the sense amplifier and the first power supply potential and a second power supply potential side transistor inserted between the sense amplifier and the second power supply potential. The first power supply potential side transistor is turned ON for a predetermined period of time; the ground potential side transistor is turned ON at about the same time as the first power supply potential side transistor and the ON state of the ground potential side transistor is maintained; and when the predetermined time period ends, the second power supply potential side transistor is turned ON.

According to such a structure, one of the bit signal lines which is closer to the power supply potential can also be rapidly raised to the first power supply potential level, and the other one of the bit signal lines which is closer to the ground potential can be pulled into the ground potential before its potential is attracted to the power supply potential. The bit signal line having the potential which had already been rapidly raised can be retained at the low level second power supply potential.

However, this structure is applicable only when the second power supply potential and the ground potential are relatively constant regardless of the amount of current and the ground potential does not substantially increase even in the case where the feedthrough current is generated in the sense amplifier.

In one embodiment of the present invention, the power supply potential is set higher than the ground potential; an N-channel transistor is used as the ground potential side transistor, and P-channel transistors are used as the first power supply potential side transistor and the second power supply potential side transistor, respectively; and the sense amplifier includes N-channel transistors which pull the one of the pair of bit signal lines which is closer to the ground potential into the ground potential via the sense amplifier and P-channel transistors which pull the other one of the pair of bit signal lines which is closer to the power supply potential into the power supply potential.

In another embodiment of the present invention, the power supply potential is set higher than the ground potential; an N-channel transistor is used as the ground potential side transistor, and a P-channel transistor and an N-channel transistor are used as the first power supply potential side transistor and the second power supply potential side transistor, respectively; and the sense amplifier includes N-channel transistors which pull the one of the pair of bit signal lines which is closer to the ground potential into the ground potential through the sense amplifier and P-channel transistors which pull the other one of the pair of bit signal lines which is closer to the power supply potential into the power supply potential.

In still another embodiment of the present invention, the semiconductor memory device further includes power supply means which is supplied with the second power supply potential and forms the first power supply potential from the second power supply potential.

In still yet another embodiment of the present invention, the semiconductor memory device further includes; a plurality of amplification units, wherein each of the plurality of amplification units includes the pair of bit signal lines, the sense amplifier, the ground potential side transistor, the first power supply potential side transistor, and the second power supply potential side transistor, wherein the plurality of amplification units are divided into a plurality of groups; power supply means for supplying the first power supply potential; and controlling means for selecting one of the plurality of groups and turning ON the first power supply potential side transistor in the amplification unit belonging to the selected group.

In still yet another embodiment of the present invention, one of the plurality of groups is selected and the first power supply potential side transistor in the amplification unit belonging to the selected group is turned ON based on a column address input.

According to still another aspect of this invention, a semiconductor memory device includes: a pair of bit signal lines; a sense amplifier disposed between the pair of bit signal lines; a ground potential side transistor inserted between the sense amplifier and a ground potential; and a high potential side transistor inserted between the sense amplifier and a high potential, wherein when the ground potential side transistor is turned ON, one of the pair of bit signal lines which has a lower potential is pulled into the ground potential via the sense amplifier, and wherein when the high potential side transistor is turned ON, the other one of the pair of bit signal lines which has a higher potential is pulled into the high potential via the sense amplifier, thereby amplifying a potential difference between the pair of bit signal lines. A predetermined power supply potential is included, and the high potential, which is higher than the power supply potential, is generated from the power supply potential. An N-channel transistor is used as the ground potential side transistor and a P-channel transistor is used as the high potential side transistor. The sense amplifier includes N-channel transistors which pull the one of the pair of bit signal lines which has a lower potential into the ground potential through the sense amplifier and P-channel transistors which pull the other one of the pair of bit signal lines which has a higher potential into the high potential. The high potential side transistor is turned ON, and then the ground potential side transistor is turned ON.

In another embodiment, only one high power supply potential is used, and one P-channel transistor is used as the first power supply potential side transistor and the second power supply potential side transistor. In this case, if the high power supply potential is set at a sufficiently high level, one of the bit signal lines which has a higher potential rapidly rises to the power supply potential. Also, the other one of the bit signal lines which has a lower potential is pulled into the ground potential before its potential is attracted to the power supply potential. As a result, the bit signal line which had been rapidly raised to the power supply potential can be retained at said power supply potential.

Thus, the invention described herein makes possible the advantage of providing a semiconductor memory device capable of realizing a higher sense amplifier operating speed.

This and other advantages of the present invention will become apparent to those skilled in the art upon reading and understanding the following detailed description with reference to the accompanying figures.

BRIEF DESCRIPTION OF THE DRAWINGS

FIG. 17 is a circuit diagram illustrating another example of ,a conventional semiconductor memory device.

FIG. 18 is a timing chart illustrating the timing of each of the signals in the device of FIG. 17.

FIG. 19 is a circuit diagram illustrating still another example of a conventional semiconductor memory device.

FIG. 20 is a timing chart illustrating the timing of each of the signals in the device of FIG. 19.

DESCRIPTION OF THE PREFERRED EMBODIMENTS

Hereinafter, the present invention will be described by way of illustrative, but non-limiting examples with reference to the accompanying drawings.

Figure 1:
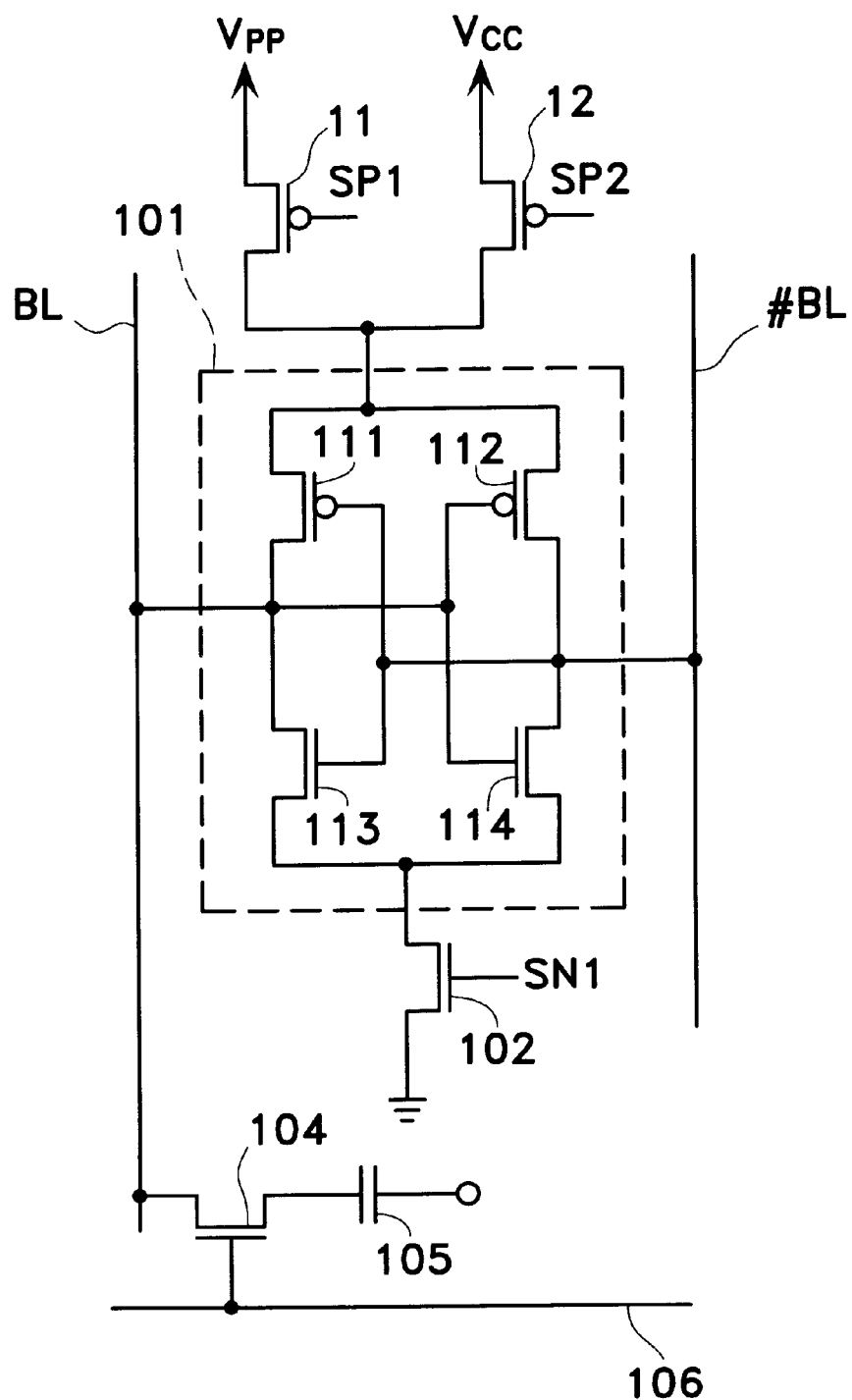
FIG. 1 is a circuit diagram illustrating a first embodiment of a semiconductor memory device according to the present invention.
Figure 13:
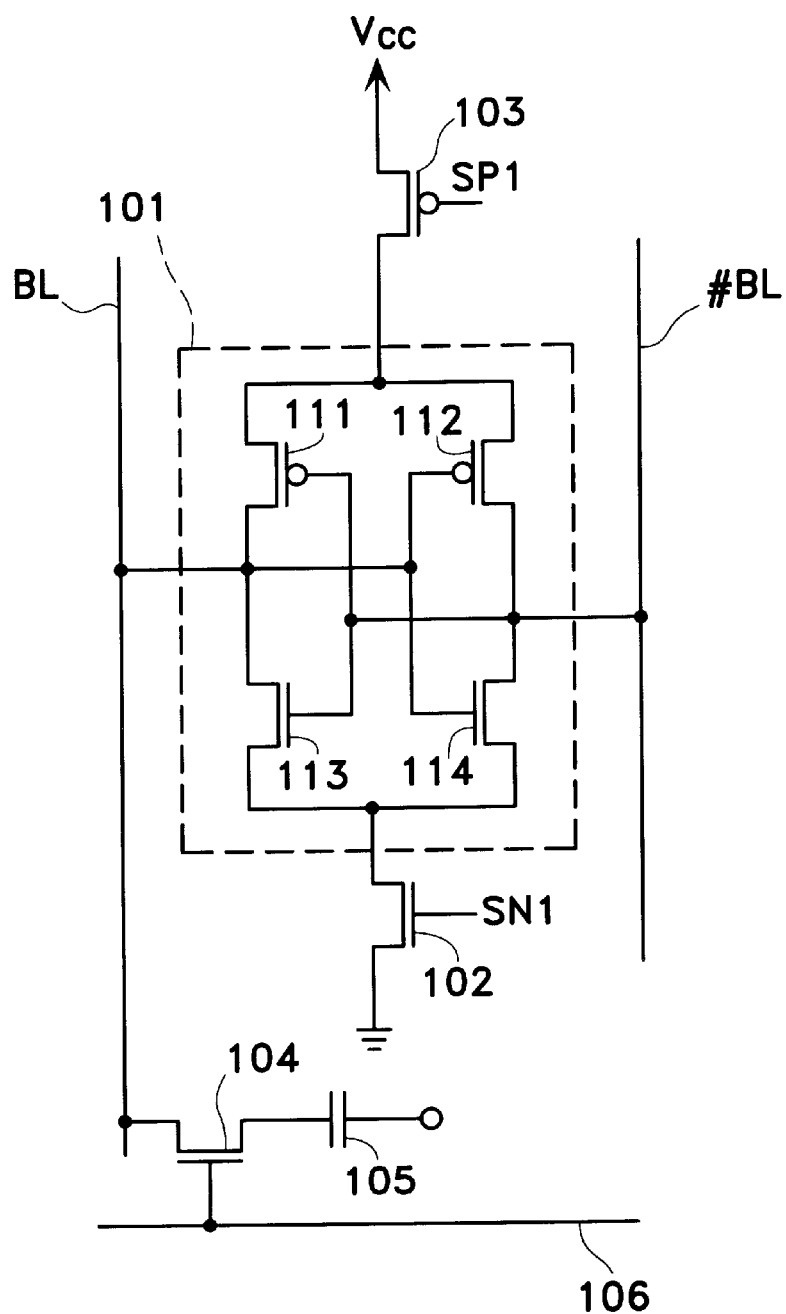
FIG. 13 is a circuit diagram illustrating one example of a conventional semiconductor memory device.
Figure 14:
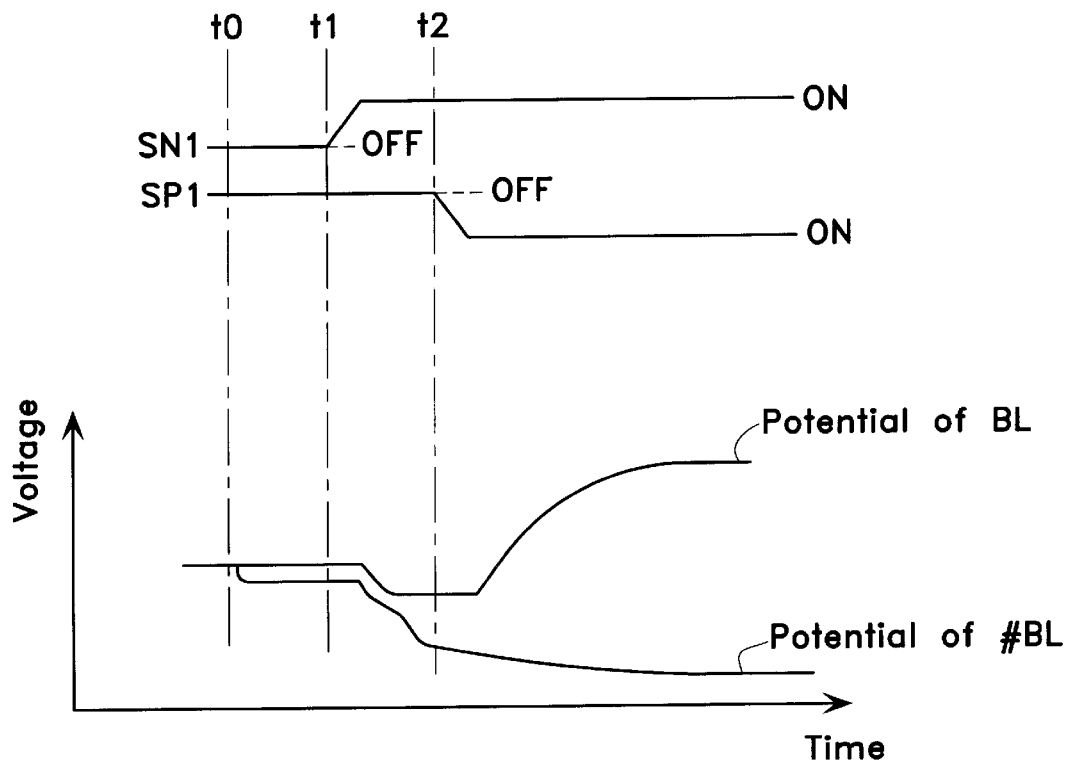
FIG. 14 is a timing chart illustrating the timing of each of the signals in the device of FIG. 13.
Figure 15:
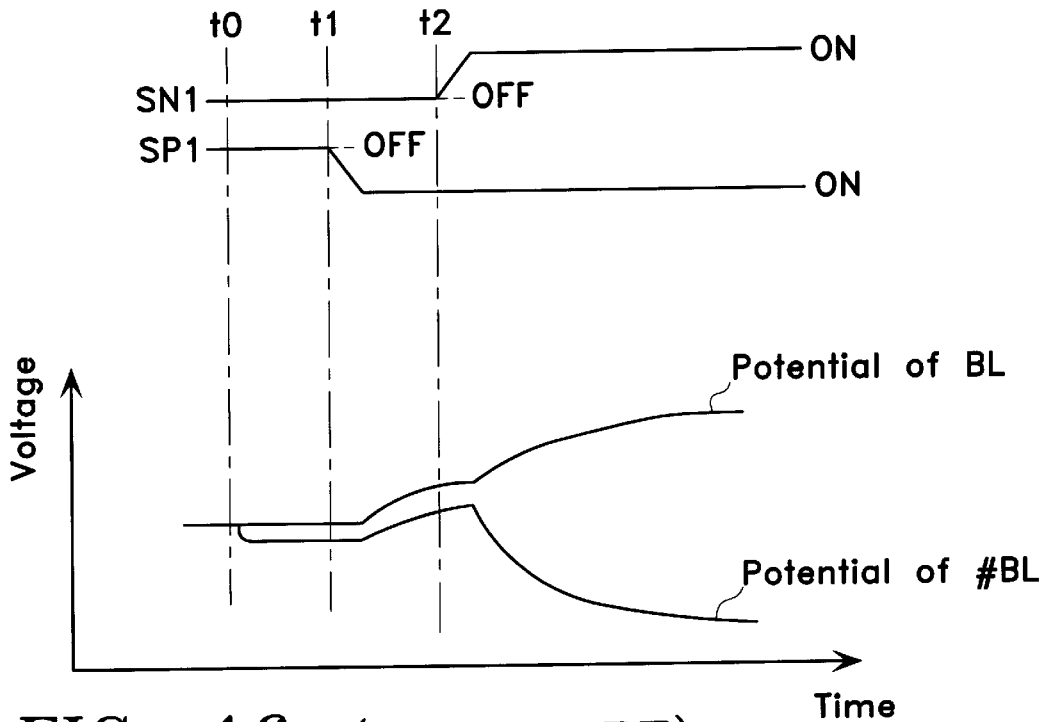
FIG. 15 is a timing chart illustrating another timing of each of the signals in the device of FIG. 13.
Figure 16:
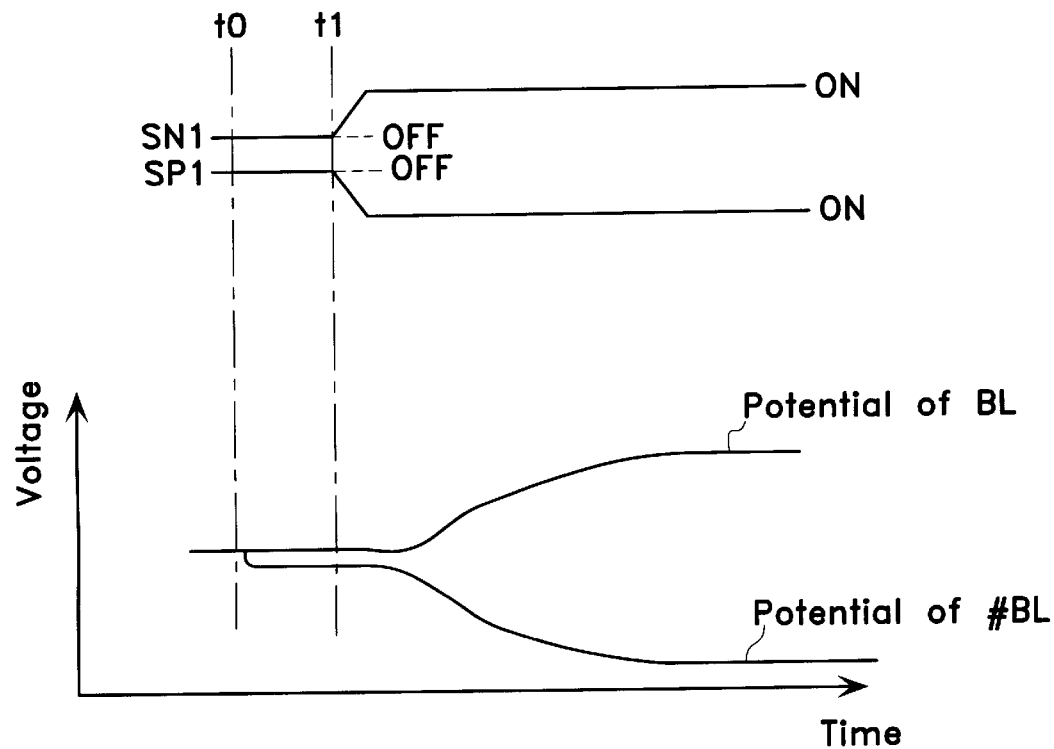
FIG. 16 is a timing chart illustrating still another timing of each of the signals in the device of FIG. 13.
Figure 21:
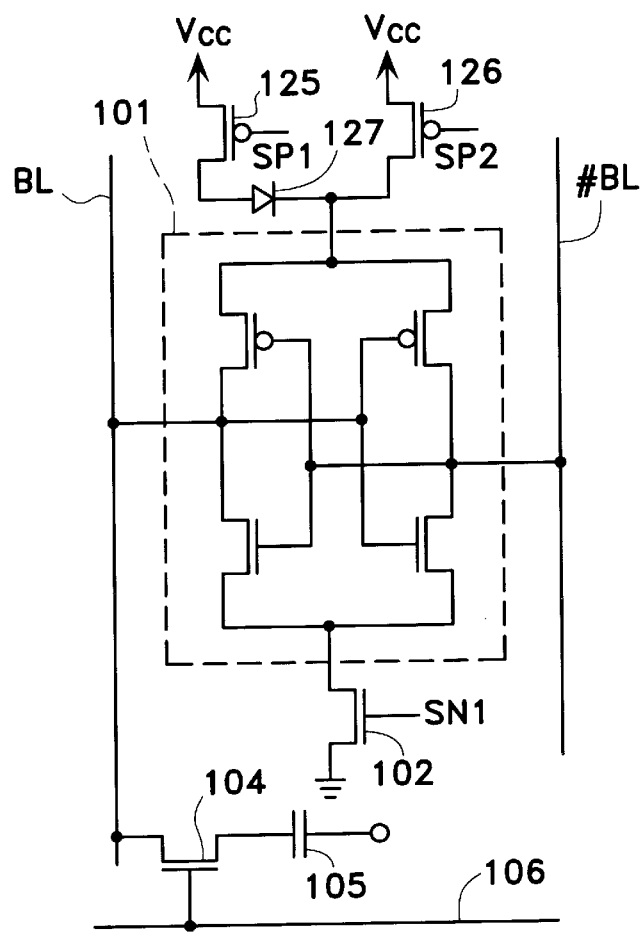
FIG. 21 is a circuit diagram illustrating still yet another example of a conventional semiconductor memory device.
Figure 22:
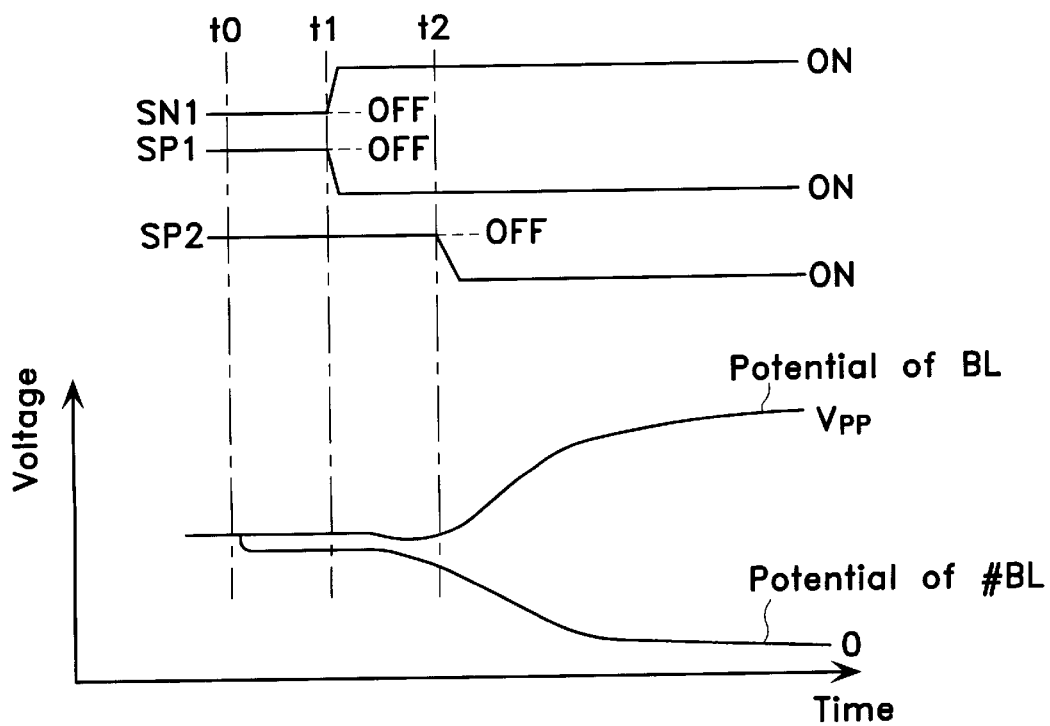
FIG. 22 is a timing chart illustrating the timing of each of the signals in the device of FIG. 21.

FIG. 1 shows a first embodiment of a semiconductor memory device according to the present invention. In the first embodiment, a first and a second power supply potential (Vpp and Vcc) are provided, respectively, wherein Vpp is obtained by boosting Vcc for use as power supply potentials. Instead of the P-channel transistor 103 shown in FIG. 13, a first P-channel transistor 11 is inserted between the first power supply potential Vpp and the sense amplifier 101, and a second P-channel transistor 12 is inserted between the second power supply potential Vcc and the sense amplifier 101.

Figure 2:
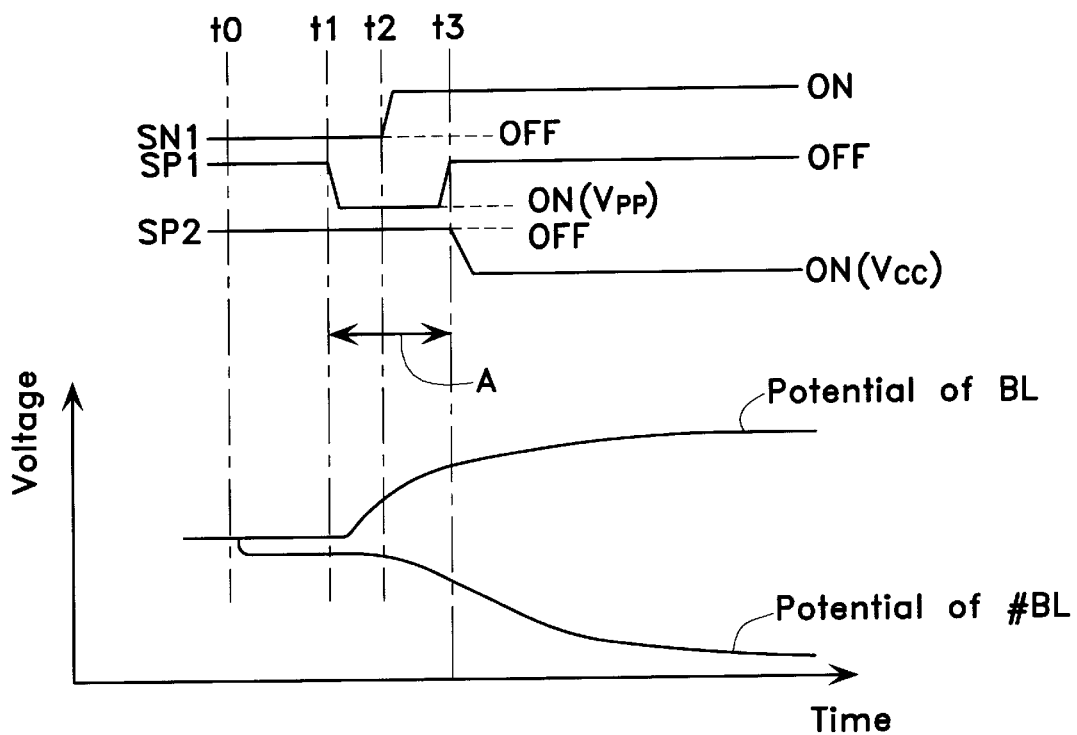
FIG. 2 is a timing chart illustrating the timing of each of the signals in the device of FIG. 1.

As shown in a timing chart of FIG. 2, a signal SP1 is switched to a low level for a time period A from a point t1 to a point t3, thereby turning ON the first P-channel transistor 11 (i.e., the first power supply potential Vpp is provided to the sense amplifier 101), and one of the bit signal lines BL and #BL which has a higher potential increases toward the first power supply potential Vpp via the sense amplifier 101. Also, at a point t2 during the time period A, a signal SN1 is switched to a high level, thereby turning ON an N-channel transistor 102, and the other one of the bit signal lines which has a lower potential decreases toward a ground potential before the bit signal line potential rises. Then, at the point t3 where the time period A terminates, the signal SP1 is switched to a high level, thereby turning OFF the first P-channel transistor 11, and the supply of the first power supply potential Vpp to the bit signal line is stopped. At the same time, a signal SP2 is switched to a low level, thereby turning ON the second P-channel transistor 12 (i.e., the second power supply potential Vcc is provided to the sense amplifier 101), and the bit signal line having a higher potential increases toward the second power supply potential Vcc via the sense amplifier 101. As a result, the bit signal line having a higher potential becomes the second power supply potential Vcc and the bit signal line having a lower potential becomes the ground potential.

Herein, the second power supply potential Vcc is set at a potential required for the reading and the rewriting of a signal charge of a memory capacitor 105. The first power supply potential Vpp is suitably set to be higher than the second power supply potential Vcc.

Accordingly, at the point t1, if the first P-channel transistor 11 is turned ON and a bit signal line increases toward the first power supply potential Vpp, the potential of the bit signal line rises more rapidly than in the case where the bit signal line increases toward the second power supply potential Vcc. As a result, the bit signal line reaches a required potential level (i.e., the second power supply potential Vcc) within a short period of time. On the other hand, the conventional semiconductor memory device shown in FIG. 13 attempts to make the bit signal line increase toward the low level power supply potential Vcc at a point where the potential of the bit signal line rises, and then the high level power supply potential Vpp is supplied. As a result, it takes additional time for the bit signal line to reach the required potential level.

At the point t2, which is slightly after the point t1, the N-channel transistor 102 is turned ON, and one of the bit signal lines which has a lower potential decreases toward the ground potential before the lower potential rises. As a result, the potential of this bit signal line quickly decreases to the ground potential level. Since the N-channel transistor 102 has a lower threshold and a higher current supplying capability as compared to the P-channel transistor, even when the potential of the signal SN1 is low, its operation is not delayed. As a result, a rapid drop in the potential of the bit signal line is realized.

Moreover, at the point t3, the first P-channel transistor 11 is turned OFF and the supply of the first power supply potential Vpp is discontinued. At the same time, the second P-channel transistor 12 is turned ON and the bit signal line with the high potential increases toward the second power supply potential Vcc. As a result, there is no need to set the potential of the bit signal line at a wastefully high level. Thus, reduced power consumption is realized in the semiconductor memory device.

As described above, the potential of one of the bit signal lines is rapidly raised and this bit signal line is made to reach the required potential level within a short period of time. Also, the other one of the bit signal lines decreases toward the ground potential before its potential rises, and the potential of the other one of the bit signal lines is rapidly lowered to the ground potential level. As a result, the time required to complete the amplification of the potential difference between the bit signal lines is significantly short as compared to the device shown in FIG. 13.

Figure 3:
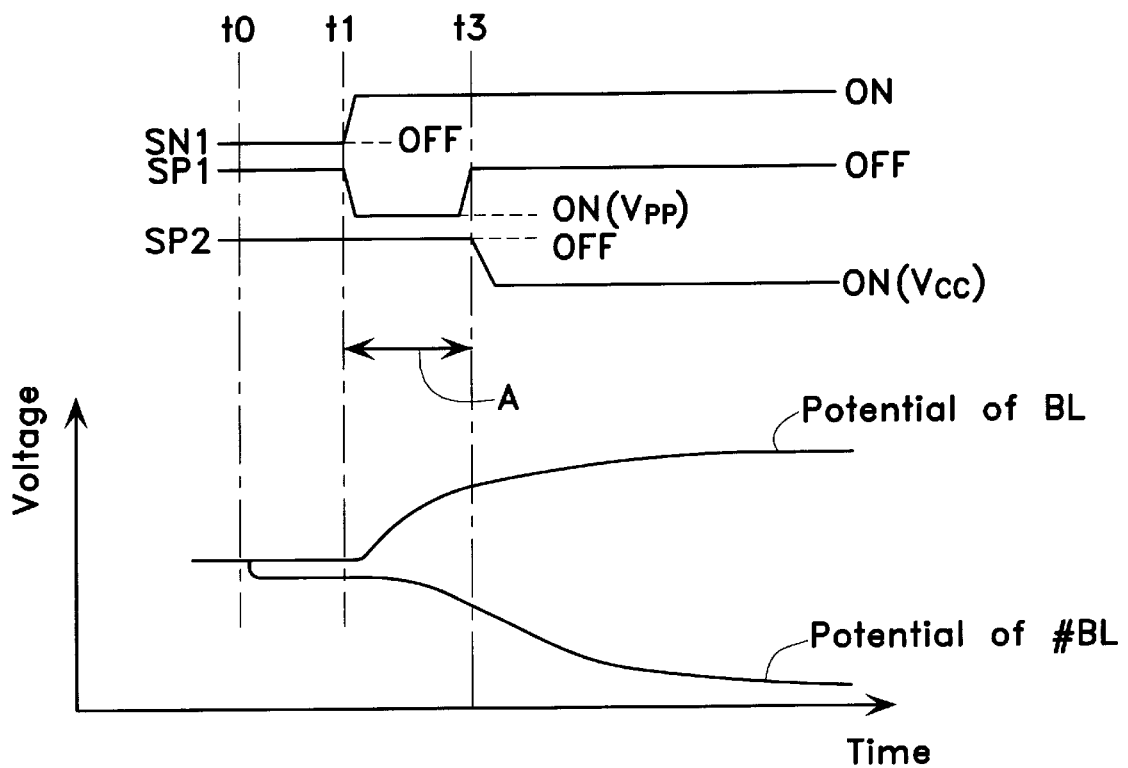
FIG. 3 is a timing chart illustrating another timing of each of the signals in the device of FIG. 1.

According to the first embodiment of the present invention, the point t1 where the first P-channel transistor 11 is turned ON and the point t2 where the N-channel transistor 102 is turned ON do not correspond to each other. As a result, no feedthrough current flowing through the sense amplifier 101 is generated, and thus no apparent rise in the ground potential occurs. However, in the case where little change occurs in the first power supply potential Vpp and the ground potential even when the feedthrough current flows, as shown in a timing chart of FIG. 3, at a point t1, the signal SP1 may be switched, thereby turning ON the first P-channel transistor 11 (i.e., the first power supply potential Vpp is provided to the sense amplifier 101); and the signal SN1 may be switched, thereby turning ON the N-channel transistor 102. Then, in the same manner as in the timing chart shown in FIG. 2, at the point t3 where the time period A ends, the signal SP1 is switched to a high level, thereby turning OFF the first P-channel transistor 11. The signal SP2 is switched to a low level, thereby turning ON the second P-channel transistor 12 (i.e., the second power supply potential Vcc is provided to the sense amplifier 101).

Figure 4:
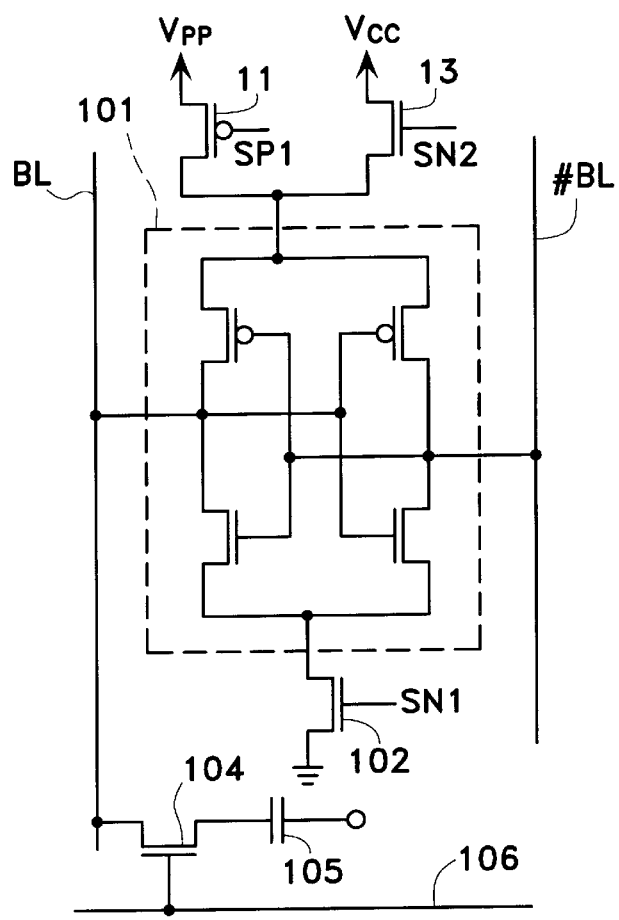
FIG. 4 is a circuit diagram illustrating a second embodiment of a semiconductor memory device according to the present invention.

FIG. 4 illustrates a second embodiment of a semiconductor memory device according to the present invention. In the second embodiment, instead of the second P-channel transistor 12 in the device shown in FIG. 1, an N-channel transistor 13 is employed.

Figure 5:
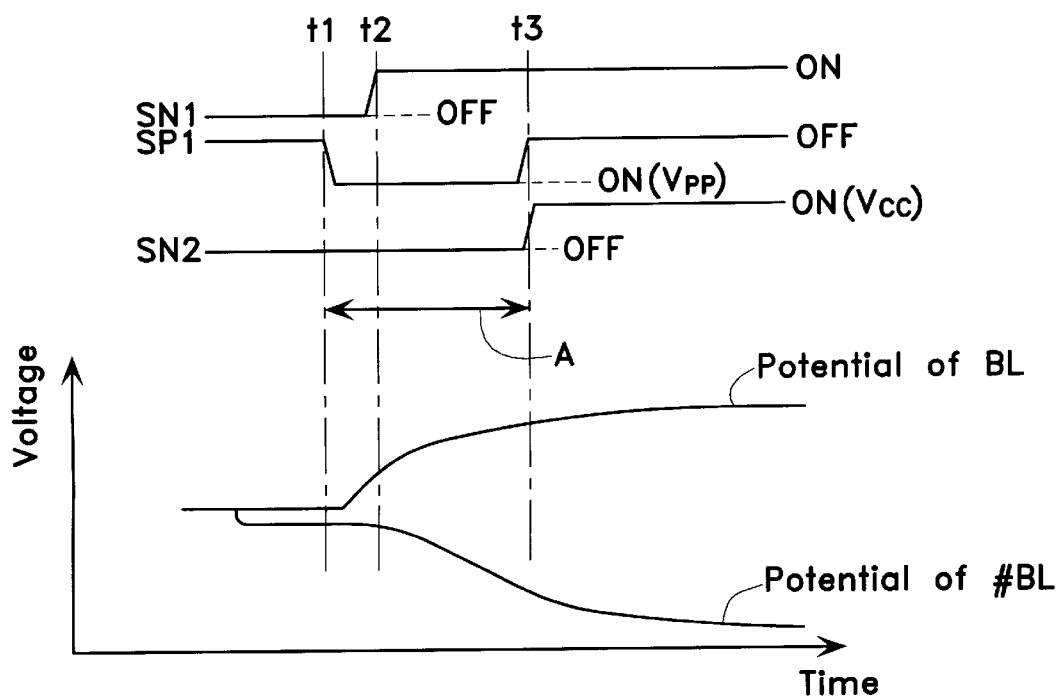
FIG. 5 is a timing chart illustrating the timing of each of the signals in the device of FIG. 4.

In the second embodiment, as shown in a timing chart of FIG. 5, a signal SP1 is switched to be a low level only for a period A from a point t1 to a point t3, thereby turning ON the first P-channel transistor 11 (i.e., the first power supply potential Vpp is provided to the sense amplifier 101), and the bit signal line with the high potential increases toward the first power supply potential Vpp, thereby rapidly raising the potential of that bit signal line. At a point t2 during the period A, a signal SN1 is switched to be a high level, thereby turning ON the N-channel transistor 102, and the bit signal line with the low potential decreases toward the ground potential before its potential rises. At the point t3 where the period A ends, the signal SP1 is switched to a high level, thereby turning OFF the first P-channel transistor 11, and the supply of the first power supply potential Vpp is discontinued. At the same time, a signal SN2 is switched to a high level, thereby turning ON the N-channel transistor 13 (i.e., the second power supply potential Vcc is provided to the sense amplifier 101), and the bit signal line with the high potential increases toward the second power supply potential Vcc. As a result, the bit signal line with the high potential becomes the second power supply potential Vcc and the bit signal line with the low potential becomes the ground potential.

Figure 6:
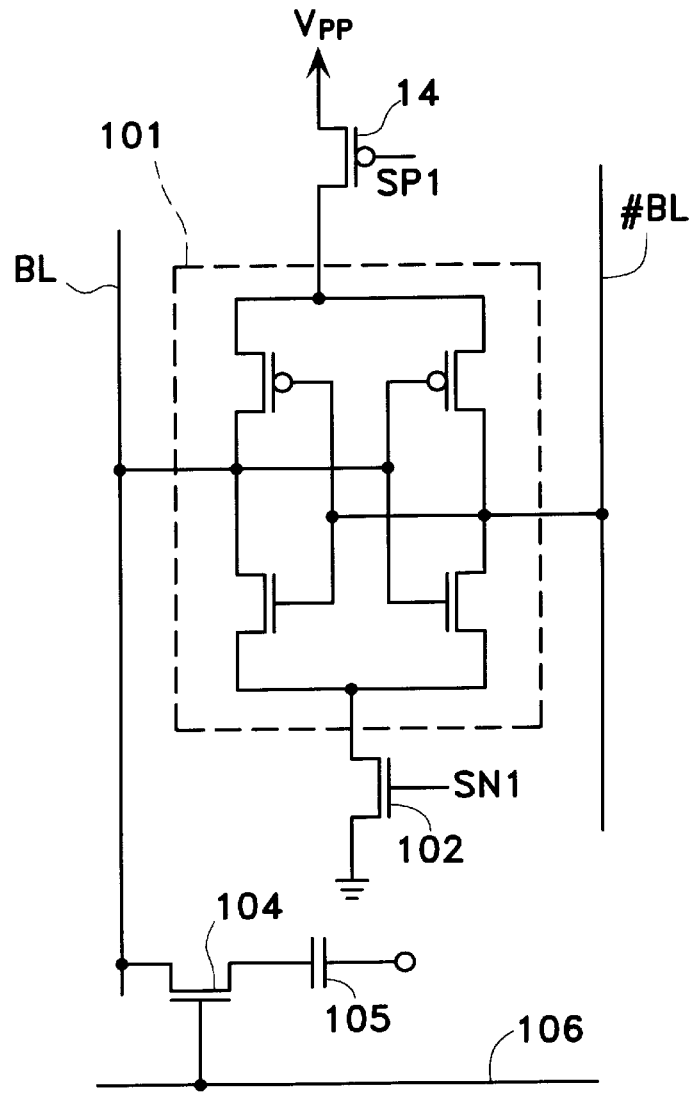
FIG. 6 is a circuit diagram illustrating a third embodiment of a semiconductor memory device according to the present invention.

FIG. 6 illustrates a third embodiment of a semiconductor memory device according to the present invention. In the third embodiment, only a first power supply potential Vpp is used and only one P-channel transistor 14 is inserted between the first power supply potential Vpp and the sense amplifier 101.

Figure 7:
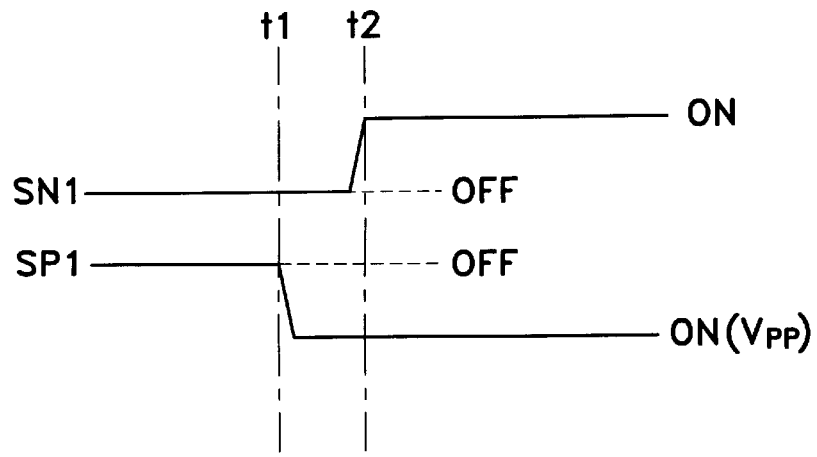
FIG. 7 is a timing chart illustrating the timing of each of the signals in the device of FIG. 6.

In the third embodiment, as shown in a timing chart of FIG. 7, at a point t1, a signal SP1 is switched to a low level, thereby turning ON the P-channel transistor 14 (i.e., the first power supply potential Vpp is provided to the sense amplifier 101), and a bit signal line with the high potential increases toward the first power supply potential Vpp, thereby rapidly raising the potential of this bit signal line. At a point t2, a signal SN1 is switched to a high level, thereby turning ON an N-channel transistor 102, and a bit signal line with the low potential decreases toward a ground potential before its potential rises. As a result, the bit signal line with the high potential becomes the first power supply potential Vpp, and the bit signal line with the low potential becomes the ground potential.

Thus, the first power supply potential Vpp, which is higher than the second power supply potential Vcc, is applied to the memory capacitor 105 so that the signal charges are stored. As a result, the data holding time of the memory capacitor 105 can be prolonged. Moreover, unlike the first and the second embodiments, only one transistor is inserted between the first power supply potential Vpp and the sense amplifier 101 in the third embodiment. As a result, the area of the circuit is reduced. However, it is necessary to improve an ability to withstand high voltage in the memory capacitor 105 and the transistor 104.

Figure 8:
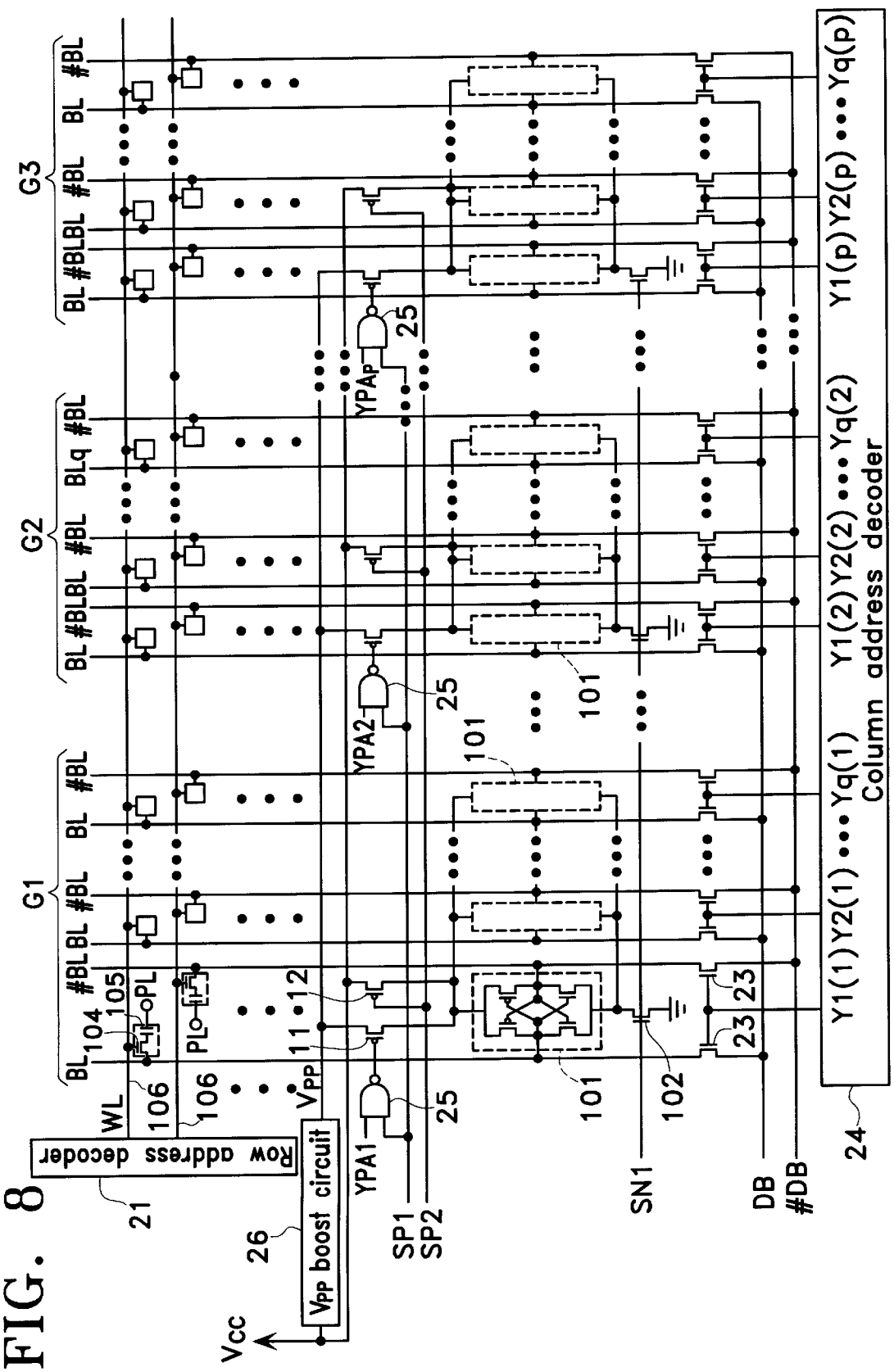
FIG. 8 is a block diagram illustrating a fourth embodiment of a semiconductor memory device according to the present invention.

FIG. 8 is a block diagram illustrating a fourth embodiment of a semiconductor memory device according to the present invention. In the semiconductor memory device of the fourth embodiment, the bit signal lines BL and #BL, the sense amplifier 101, the N-channel transistor 102, the first P-channel transistor 11, and the second P-channel transistor 12 which are shown in FIG. 1 are considered as one amplification unit, and a plurality of such amplification units are provided. These amplification units are divided into a plurality of groups G1, G2, . . . Gn.

For each of the groups G1, G2, . . . Gn, the N-channel transistor 102, the first P-channel transistor 11 and the second P-channel transistor 12 is shared among the amplification units.

For each of the amplification units, the bit signal lines BL and #BL are connected to the memory capacitor 105 via the transistor 104, and the gate of the transistor 104 is connected to a row address decoder 21 via a word signal line 106. The bit signal lines BL and #BL are connected to data signal lines DB and #DB via transistors 22 and 23, respectively. Gates of the transistors 22 and 23 are connected to a column address decoder 24.

For each of the groups G1, G2, . . . Gn, an AND circuit 25 is provided. The AND circuit 25 inputs a group selecting signal YPAi and a signal SP1 and supplies a logical product of these signals to the first P-channel transistor 11 of each group. A signal SP2 and a signal SN1 are supplied to the second P-channel transistor 12 and the N-channel transistor 102, respectively.

A second power supply potential Vcc is supplied to the second P-channel transistor 12 and a boost circuit 26 boosts the second power supply potential Vcc so as to form a first power supply potential Vpp. The first power supply potential Vpp is supplied to the first P-channel transistor 11.

In such a structure, the row address decoder 21 selects one of the word signal lines 106 so as to turn ON the transistors 104 via the selected word signal line 106. These transistors 104 are used to transfer signal charges in the memory capacitor 105 to one of the bit signal lines BL and #BL in each of the amplification units. Thus, for every amplification unit, a potential difference is generated between the bit signal lines BL and #BL.

At this time, one of the groups G1, G2, . . . Gn is selected by an access from the external, and a high level group selecting signal YPAi is supplied only to the AND circuit 25 in the selected group. In response to the high level group selecting signal YPAi, the AND circuit 25 in the selected group supplies the signal SP1 to the first P-channel transistor 11. As a result, the first power supply potential Vpp in the selected group is supplied to the sense amplifiers 101 through the first P-channel transistor 11. For each of the sense amplifiers 101, as shown in the timing chart of FIG. 2 described above, the first and the second P-channel transistors 11 and 12 and the N-channel transistor 102 are turned ON at their respective timing in response to the signals SP1, SN1, and SP2. As a result, the potential difference between the bit signal lines BL and #BL is amplified quickly.

Next, the column address decoder 24 sequentially turns ON the transistors 22 and 23 in the amplification units within each selected group so as to sequentially send potential differences between the bit signal lines BL and #BL in these amplification units to the data signal lines DB and #DB.

On the other hand, in each of the other groups which were not selected, no high level group selecting signal YPAi is supplied to the AND circuit 25. As a result, only the low level second power supply potential Vcc is supplied to the sense amplifier 101, and thus the amplification of the potential difference between the bit signal lines BL and #BL is delayed. However, since a sufficient amount of time is taken to complete the reading and the rewriting of the signal charges in each of the memory capacitors 105 in the previously selected group, there is enough time to perform the amplification of the potential difference between the bit signal lines BL and #BL. Therefore, immediately after the reading and the rewriting of the signal charges in each of the memory capacitors 105 in the previously selected group, the reading and the rewriting of the signal charges in the memory capacitors 105 in each of the groups which were not selected can be performed.

As described above, since one of the groups G1, G2, . . . Gn is selected and the first power supply potential Vpp is supplied to each of the sense amplifiers 101 only in the selected group, an increase in the amount of current resulting from the supply of the first power supply potential Vpp can be minimized. Thus, the loading on the boost circuit 26 can be reduced.

Figure 9:
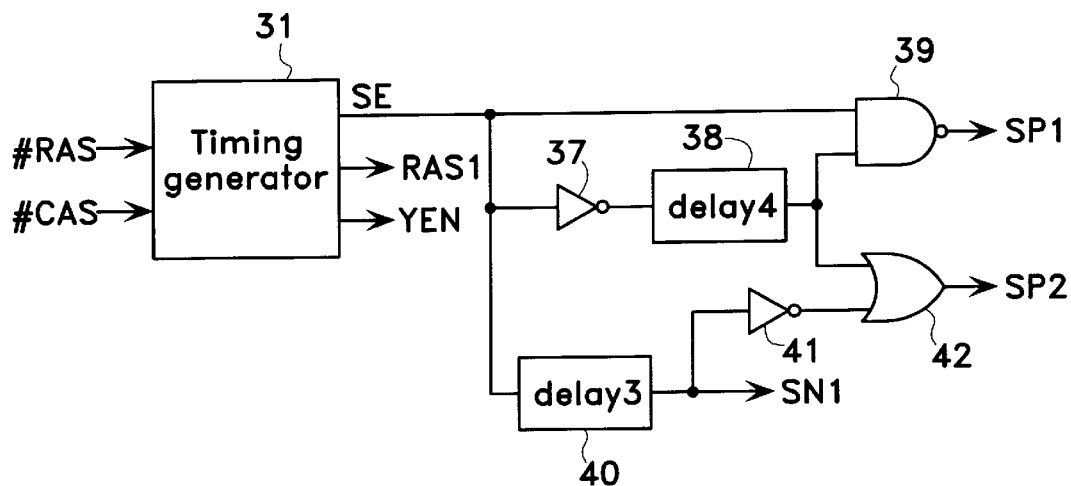
FIG. 9 is a combined block and schematic diagram illustrating a circuit for forming the signals SP1, SN1, and SP2 shown in the timing chart of FIG. 2.
Figure 10:
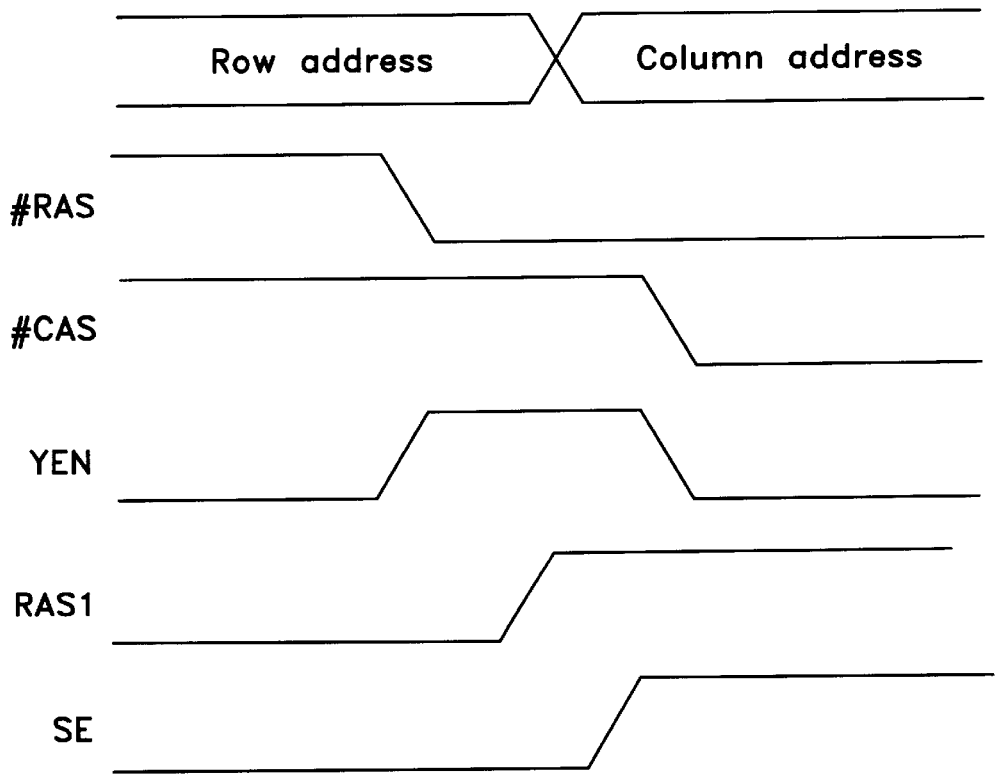
FIG. 10 is a timing chart illustrating the timing of each of the signals in the circuit of FIG. 9.

FIG. 9 illustrates a circuit for forming the signals SP1, SN1, and SP2 shown in the timing chart of FIG. 2. In the circuit, a timing generator 31 inputs a row address strobe signal #RAS and a column address strobe signal #CAS (shown in a timing chart of FIG. 10) and outputs timing signals YEN, RAS1, and SE (shown in the timing chart of FIG. 10).

Figure 11:
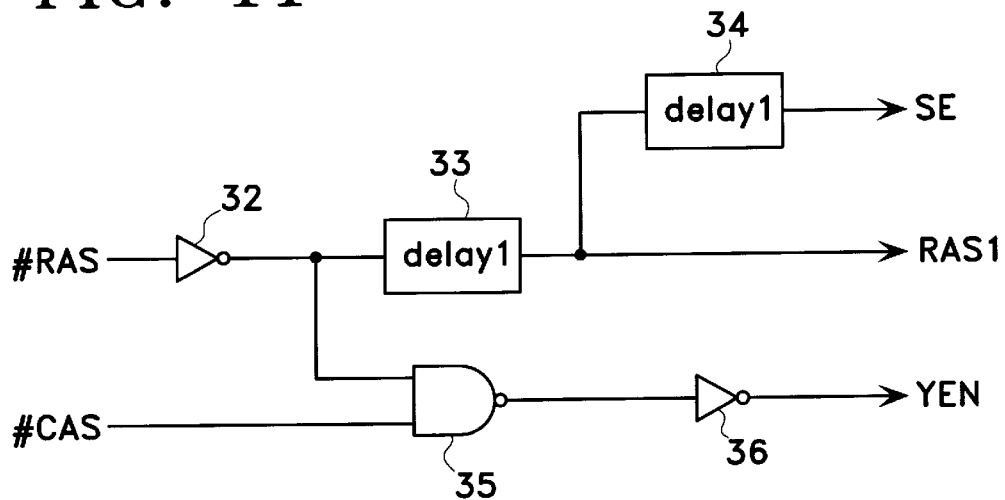
FIG. 11 is a circuit diagram illustrating a timing generator in the circuit of FIG. 9.

The timing generator 31 is structured as shown in FIG. 11. The row address strobe signal #RAS is input to an inverting circuit 32, and the output of the inverting circuit 32 is delayed through a first delay circuit 33 so as to form the timing signal RAS1. Moreover, the output of the inverting circuit 32 is delayed through the first delay circuit 33 and a second delay circuit 34 so as to form the timing signal SE. Furthermore, the output of the inverting circuit 32 and the column address strobe signal #CAS are supplied to a NAND circuit 35. The output of the NAND circuit 35 is inverted through an inverting circuit 36 so as to form the timing signal YEN.

As shown in FIG. 9, after the timing signal SE is inverted by an inverting circuit 37 and delayed by a fourth delay circuit 38, the timing signal SE is supplied to a NAND circuit 39. The NAND circuit 39 inputs the output of the fourth delay circuit 38 and the timing signal SE so as to obtain their logical product. This logical product is inverted and the resultant is output as the signal SP1 shown in the timing chart of FIG. 2. A third delay circuit 40 delays the timing signal SE and outputs the resulting signal as the signal SN1 shown in the timing chart of FIG. 2. Also, the output of the third delay circuit 40 is supplied to an OR circuit 42 through an inverting circuit 41. The OR circuit 42 obtains the logical sum of the output of the fourth delay circuit 38 and the output of the inverting circuit 41 and outputs the logical sum as the signal SP2 shown in the timing chart of FIG. 2.

Figure 12:
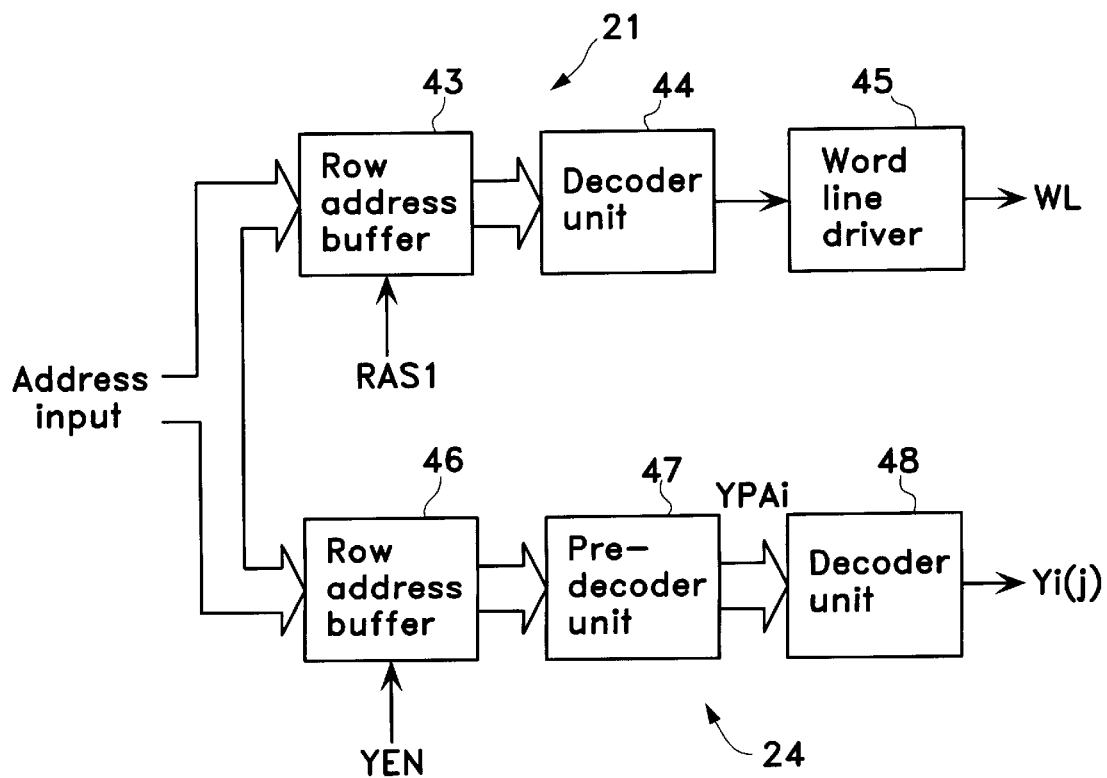
FIG. 12 is a block diagram illustrating a row address decoder and a column address decoder in FIG. 8.

FIG. 12 illustrates a general structure of the row address decoder 21 and the column address decoder 24 shown in FIG. 8.

In the row address decoder 21, a row address buffer 43 inputs the timing signal RAS1 from the timing generator 31. When the timing signal RAS1 is input to the row address buffer 43, the row address buffer 43 latches a row address (shown in the timing chart of FIG. 10) and supplies the row address to a decoder unit 44. The decoder unit 44 decodes the row address, and designates the word signal line 106 corresponding to the row address to a word line driver 45. The word line driver 45 turns ON the transistors 104 through the word signal line 106.

In the column address decoder 24, a column address buffer 46 inputs the timing signal YEN from the timing generator 31. After the timing signal YEN is activated, the column address buffer 46 latches a column address (shown in the timing chart of FIG. 10) and supplies the column address to a pre-decoder unit 47. The pre-decoder unit 47 decodes the column address and generates the signal YPAi which indicates one of the groups G1, G2, . . . Gn, thereby supplying the signal YPAi to a decoder unit 48. The decoder unit 48 outputs a signal Yi(j) for sequentially turning ON the transistors 22 and 23 in the amplification units within the group corresponding to the signal YPAi.

As described above, according to the semiconductor memory device of the present invention, firstly, the first power supply potential side transistor is turned ON for a predetermined period of time. As a result, one of the bit signal lines which is closer to the power supply potential rapidly rises to the high first power supply potential through the sense amplifier. Next, the ground potential side transistor is turned ON. Thus, the other one of the bit signal lines which is closer to the ground potential decreases toward the ground potential before its potential is attracted to the power supply potential. Finally, the first power supply potential side transistor is turned OFF, and at the same time, the second power supply potential side transistor is turned ON. As a result, the bit signal line having the potential which had already been rapidly raised can be retained at the low second power supply potential.

Alternatively, firstly, the first power supply potential side transistor is turned ON for a predetermined period of time, and the ground potential side transistor is simultaneously turned ON. Thereafter, the first power supply potential side transistor is turned OFF and the second power supply potential side transistor is turned ON.

In this manner, one of the bit signal lines which is closer to the power supply potential can also be rapidly raised to the first power supply potential level, and the other one of the bit signal lines which is closer to the ground potential can decrease toward the ground potential before its potential is attracted to the power supply potential. The bit signal line having the potential which had already been rapidly raised can be retained at the low second power supply potential.

However, the latter case is applicable only when the second power supply potential and the ground potential do not substantially change regardless of the amount of current conduction and the ground potential does not substantially increase even when feedthrough current is generated in the sense amplifier.

Moreover, from a predetermined level of power supply potential, a high potential which is higher than the predetermined level of power supply potential is generated. The N-channel transistor is used as the ground potential side transistor, whereas the P-channel transistor is used as the high-potential side transistor. The sense amplifier includes: the N-channel transistor which makes one of the bit signal lines which has a lower potential decrease toward the ground potential via the sense amplifier; and the P-channel transistor which makes the other one of the bit signal lines which has a higher potential increase toward the high potential. The high potential side transistor is turned ON, and then the ground potential side transistor is turned ON.

Herein, one power supply potential is used, and only one P-channel transistor is used as the power supply potential side transistor. In this case, the power supply potential is set at a high level so that one of the bit signal lines which has a higher potential can be rapidly raised to the power supply potential level. The other one of the bit signal lines which has a lower potential decreases toward the ground potential before its potential is attracted to the power supply potential. Thus, the bit signal line which had rapidly risen to the power supply potential level is held at the power supply potential.

A pair of bit signal lines, the sense amplifier, the ground potential side transistor, the first power supply potential side transistor and the second power supply potential side transistor are grouped into one amplification unit, and a plurality of such amplification units are provided. These amplification units are divided into a plurality of groups. Power supply means for supplying the first power supply potential and controlling means for selecting one of the groups and turning ON the first power supply potential side transistors in the amplification units belonging to the selected group are provided.

Herein, since one of the groups is selected, and the first power supply potential side transistors in the amplification units belonging to the selected group are turned ON, and the first power supply potential is not supplied to all of the amplification units at the same time. Thus, the generation of a large amount of current at the time of supplying the first power supply potential can be prevented, and thus the shortage of supply current can be avoided.

In this case, one of the groups may be selected based on an externally input pre-decode signal in the column address, and the first power supply potential side transistors in the amplification units belonging to the selected group may be turned ON.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising: a pair of bit signal lines; a sense amplifier disposed between the pair of bit signal lines; a ground potential side transistor inserted between the sense amplifier and a ground potential; and a power supply potential side transistor circuit inserted between the sense amplifier and a power supply potential network, wherein when the ground potential side transistor is turned ON, one of the pair of bit signal lines which is closer to the ground potential is pulled into the ground potential via the sense amplifier, and wherein when the power supply potential side transistor circuit is turned ON, the other one of the pair of bit signal lines which is closer to the power supply potential is pulled into the power supply potential via the sense amplifier, thereby amplifying a potential difference between the pair of bit signal lines, wherein the power supply potential network includes a first power supply potential Vpp and a second power supply potential Vcc and Vpp is greater than Vcc, wherein the power supply potential side transistor circuit includes a first power supply potential side transistor inserted between the sense amplifier and the first power supply potential and a second power supply potential side transistor inserted between the sense amplifier and the second power supply potential, and wherein the first power supply potential side transistor is turned ON for a predetermined period of time; the ground potential side transistor is turned ON during the predetermined time period and the ON state of the ground potential side transistor is maintained, and when the predetermined time period ends, the first power supply potential side transistor is turned OFF and the second power supply potential side transistor is turned ON.

2. The semiconductor memory device according to claim 1, wherein the power supply potential is set higher than the ground potential;

an N-channel transistor is used as the ground potential side transistor and P-channel transistors are used as the first and the second power supply potential side transistors; and the sense amplifier includes N-channel transistors which pull the one of the pair of bit signal lines which is closer to the ground potential into the ground potential via the sense amplifier and P-channel transistors which pull the other one of the pair of bit signal lines which is closer to the power supply potential into the power supply potential.

3. The semiconductor memory device according to claim 1, wherein the power supply potential is set higher than the ground potential;

an N-channel transistor is used as the ground potential side transistor and a P-channel transistor and an N-channel transistor are used as the first power supply potential side transistor and the second power supply potential side transistor, respectively; and the sense amplifier includes N-channel transistors which pull the one of the pair of bit signal lines which is closer to the ground potential into the ground potential via the sense amplifier and P-channel transistors which pull the other one of the pair of bit signal lines which is closer to the power supply potential into the power supply potential.

4. The semiconductor memory device according to claim 1, further comprising power supply means which is supplied with the second power supply potential and forms the first power supply potential from the second power supply potential.

5. The semiconductor memory device according to claim 1, further comprising a plurality of amplification units, wherein each of the plurality of amplification units includes the pair of bit signal lines, the sense amplifier, the ground potential side transistor, the first power supply potential side transistor, and the second power supply potential side transistor, wherein the plurality of amplification units are divided into a plurality of groups, and power supply means for supplying the first power supply potential, and controlling means for selecting one of the plurality of groups and turning ON the first power supply potential side transistor in the amplification unit belonging to the selected group.

6. The semiconductor memory device according to claim 5, wherein one of the plurality of groups is selected and the first power supply potential side transistor in the amplification unit belonging to the selected group is turned ON based on a column address input.

7. A semiconductor memory device comprising: a pair of bit signal lines; a sense amplifier disposed between the pair of bit signal lines; a ground potential side transistor circuit inserted between the sense amplifier and a ground potential; and a power supply potential side transistor circuit inserted between the sense amplifier and a power supply potential network, wherein when the ground potential side transistor is turned ON, one of the pair of bit signal lines which is closer to the ground potential is pulled into the ground potential via the sense amplifier, and wherein when the power supply potential side transistor circuit is turned ON, the other one of the pair of bit signal lines which is closer to the power supply potential is pulled into the power supply potential via the sense amplifier, thereby amplifying a potential difference between the pair of bit signal lines, wherein the power supply potential network includes a first power supply potential Vpp and a second power supply potential Vcc and Vpp is greater than Vcc, wherein the power supply potential side transistor circuit includes a first power supply potential side transistor inserted between the sense amplifier and the first power supply potential and a second power supply potential side transistor inserted between the sense amplifier and the second power supply potential, and wherein the first power supply potential side transistor is turned ON for a predetermined period of time; the ground potential side transistor is turned ON at about the same time as the first power supply potential side transistor is maintained; and when the predetermined time period ends, the first power supply potential side transistor is turned OFF and the second power supply potential side transistor is turned ON.

8. The semiconductor memory device according to claim 7, wherein the power supply potential is set higher than the ground potential;

an N-channel transistor is used as the ground potential side transistor, and P-channel transistors are used as the first power supply potential side transistor and the second power supply potential side transistor, respectively; and the sense amplifier includes N-channel transistors which pull the one of the pair of bit signal lines which is closer to the ground potential into the ground potential via the sense amplifier and P-channel transistors which pull the other one of the pair of bit signal lines which is closer to the power supply potential into the power supply potential.

9. The semiconductor memory device according to claim 7, wherein the power supply potential is set higher than the ground potential;

an N-channel transistor is used as the ground potential side transistor, and a P-channel transistor and an N-channel transistor are used as the first power supply potential side transistor and the second power supply potential side transistor, respectively; and the sense amplifier includes N-channel transistors which pull the one of the pair of bit signal lines which is closer to the ground potential into the ground potential through the sense amplifier and P-channel transistors which pull the other one of the pair of bit signal lines which is closer to the power supply potential into the power supply potential.

10. The semiconductor memory device according to claim 7, further comprising power supply means which is supplied with the second power supply potential and forms the first power supply potential from the second power supply potential.

11. The semiconductor memory device according to claim 7, further comprising a plurality of amplification units, wherein each of the plurality of amplification units includes the pair of bit signal lines, the sense amplifier, the ground potential side transistor, the first power supply potential side transistor, and the second power supply potential side transistor, wherein the plurality of amplification units are divided into a plurality of groups, and power supply means for supplying the first power supply potential, and controlling means for selecting one of the plurality of groups and turning ON the first power supply potential side transistor in the amplification unit belonging to the selected group.

12. The semiconductor memory device according to claim 11, wherein one of the plurality of groups is selected and the first power supply potential side transistor in the amplification unit belonging to the selected group is turned ON based on a column address input.

* * * * *